United States Patent [19]
Oh et al.

[11] Patent Number: 5,583,499
[45] Date of Patent: Dec. 10, 1996

[54] METHOD AND APPARATUS FOR COMPUTING ERROR LOCATOR POLYNOMIAL FOR USE IN A REED-SOLOMON DECODER

[75] Inventors: Young-Uk Oh, Incheon; Dae-Young Kim, Seoul, both of Rep. of Korea

[73] Assignee: Samsung Electronics Co., Ltd., Suwon, Rep. of Korea

[21] Appl. No.: 365,256

[22] Filed: Dec. 28, 1994

[30]    Foreign Application Priority Data

Dec. 29, 1993  [KR]   Rep. of Korea ..................... 93-30987

[51] Int. Cl.$^6$ ................................................ H03M 13/00
[52] U.S. Cl. ........................... 341/94; 371/37.1; 371/37.5
[58] Field of Search ............................ 341/94; 371/37.1, 371/37.5, 40.3, 41, 40.2

[56]           References Cited

U.S. PATENT DOCUMENTS

| | | | |
|---|---|---|---|
| 4,162,480 | 7/1979 | Berlekamp | 340/146.1 AL |
| 4,504,948 | 3/1985 | Patel | 371/38 |
| 4,845,713 | 7/1989 | Zook | 371/37 |
| 5,384,786 | 1/1995 | Dudley et al. | 371/37.1 |
| 5,446,743 | 8/1995 | Zook | 371/37.1 |
| 5,495,488 | 2/1996 | Nakamura | 371/37.1 |

FOREIGN PATENT DOCUMENTS

| | | |
|---|---|---|
| 0545498 | 6/1993 | European Pat. Off. . |
| 0567148 | 10/1993 | European Pat. Off. . |
| 01007816 | 1/1989 | Japan . |
| WO-A-8810032 | 12/1988 | WIPO . |

*Primary Examiner*—Jeffrey A. Gaffin
*Assistant Examiner*—Jason L. W. Kost

[57]            ABSTRACT

In a decoding system which decodes a transmitted signal encoded by using a Reed-Solomon code, an error locator polynomial of the nth iteration is calculated based on a predetermined number of syndrome values; a group of variables of the (n-1)st iteration including a discrepancy and an error locator polynomial thereof; and an error locator polynomial of the (n-2)nd iteration. The method for providing the error locator polynomial comprises the steps of calculating a discrepancy of the nth iteration based on the syndrome values and the error locator polynomial of the (n-1)st iteration; calculating a temporal term based on the discrepancy of the (n-1)st iteration and the error locator polynomial of the (n-2)nd iteration; determining a correction term based on the temporal term and the discrepancy of the nth iteration; and computing the error locator polynomial of the nth iteration based on the correction term and the error locator polynomial of the (n-1)st iteration.

6 Claims, 4 Drawing Sheets

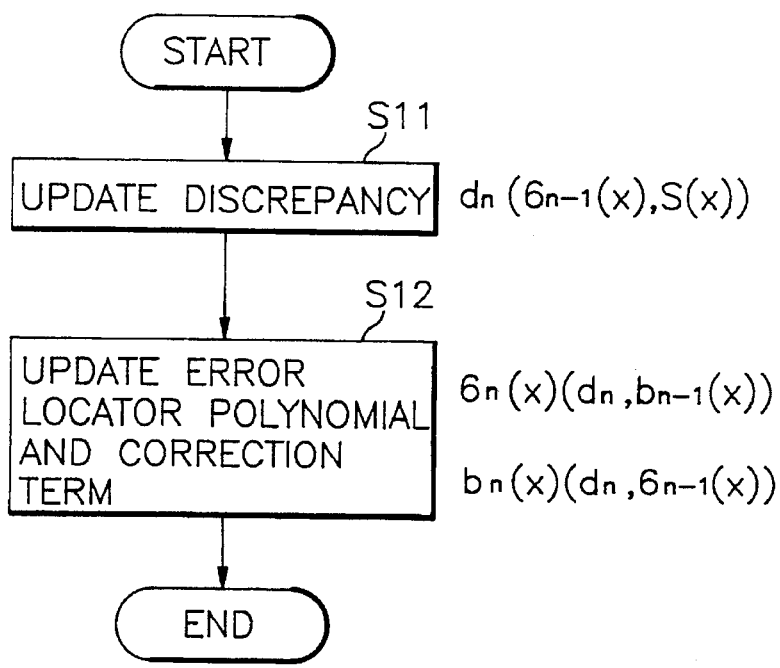
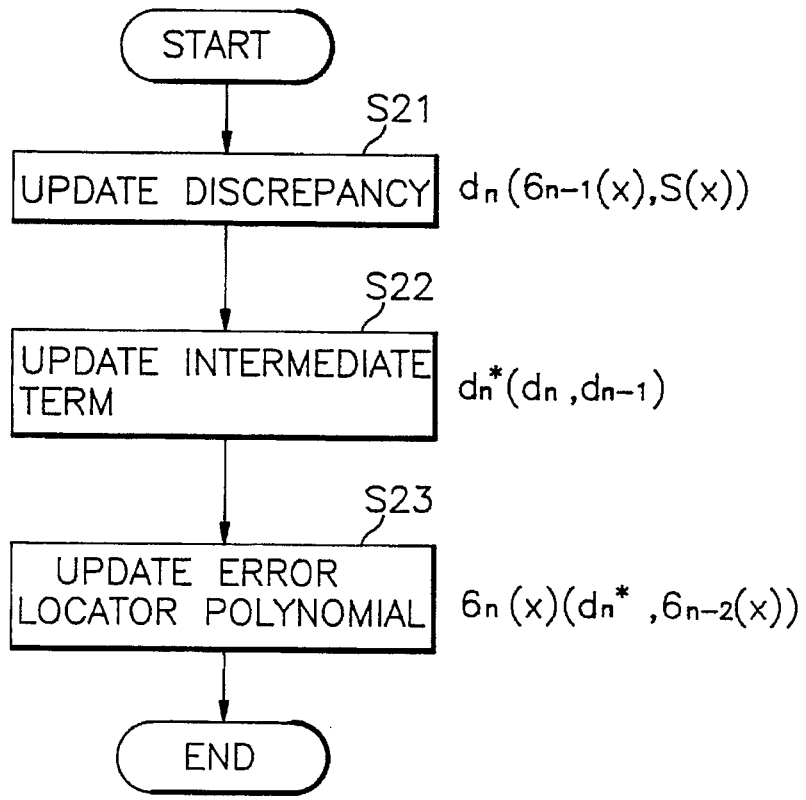

METHOD AND APPARATUS FOR COMPUTING ERROR LOCATOR POLYNOMIAL FOR USE IN A REED-SOLOMON DECODER

FIELD OF THE INVENTION

The present invention relates to a method and apparatus for correcting errors present in stored or transmitted data; and, more particularly, to a method and apparatus for determining coefficients of an error locator polynomial for use in correcting errors in the data encoded by using a Reed-Solomon code.

DESCRIPTION OF THE PRIOR ART

Noises occurring during a process of transmitting, storing or retrieving data can in turn cause errors in the transmitted, stored or retrieved data. Accordingly, various encoding techniques, having the capability of rectifying such errors, for encoding the data to be transmitted or stored have been developed.

In such encoding techniques, a set of check bits is appended to a group of message or information bits to form a codeword. The check bits, which are determined by an encoder, are used to detect and correct the errors. In this regard, the encoder essentially treats the bits comprising the message bits as coefficients of a binary message polynomial and derives the check bits by operating a generator polynomial G(X) on the message polynomial by multiplication or division. The generator polynomial is selected to impart desired properties to a codeword upon which it operates so that the codeword will belong to a particular class of error-correcting binary group codes(see, e.g., S. Lin et al., "Error Control Coding: Fundamentals and Applications", Prentice-Hall, 1983).

One class of error correcting codes is the well-known BCH (Bose-Chaudhuri-Hocquenghen) codes, which includes Reed-Solomon codes. The mathematical basis of Reed-Solomon codes is explained in, e.g., the aforementioned reference by Lin et al. and also in Berlekamp, "Algebraic Coding Theory", McGraw-Hill, 1968, which is further referred to in U.S Pat. No. 4,162,480 issued to Berlekamp.

A Reed-Solomon code has a generator polynomial G(X) defined as follows:

$$G(X) = \sum_{i=1}^{d-1} (X - a^i) \qquad \text{Eq. (1)}$$

wherein a is a primitive element in the Galois Field $GF(2^m)$, and d is the code's designed distance.

In the process of receiving or retrieving a transmitted or stored codeword, certain attendant noises may have been converted to an error pattern in the codeword. In order to deal with the error pattern imposed upon Reed-Solomon codes, a four step procedure is generally utilized. In discussing the error-correcting procedure, reference shall be made to a Reed-Solomon code consisting of codewords containing n m-bit symbols (of which k symbols are informational symbols and n-k symbols are check symbols). As a first error correcting step, syndrome values $S_0, S_1, \ldots, S_{n-k-1}$ are calculated. As a second step, using the syndrome values, coefficients of an error locator polynomial $\sigma(X)$ are calculated. In a third step, the error locator polynomial $\sigma(X)$ is solved to obtain its roots $X_i$, which represent the error locations in the received codewords. As a fourth step, using the error locations $X_i$ and the syndrome values, error values are calculated. Mathematical expressions for the syndrome values and the coefficients of the error locator polynomial are set forth in the afore-referenced U.S. Pat. No. 4,162,480 issued to Berlekamp.

The second step in the generalized error correcting procedure described above, i.e., the step of calculating the coefficients of the error locator polynomial, requires a rather laborious computational task. A popular algorithm for obtaining the coefficients of the error locator polynomial is the Berlekamp-Massey algorithm which is described in the afore-mentioned references.

In the Berlekamp-Massey algorithm, the error locator polynomial is obtained by an iterative method. Specifically, the error locator polynomial is updated based on the syndrome values on each iteration. In order to calculate the coefficients of the error locator polynomial, various variables, e.g., correction terms, discrepancy, etc., are introduced. The multipliers are used to update the variables and the error locator polynomial on each iteration.

For a t-error correcting Reed-Solomon coder 6t multipliers are needed in calculating the error locator polynomial using the Berlekamp-Massey algorithm, wherein t represents the error correcting capability of the code. The syndrome values are inputted every 2 symbol clock cycles to be used in calculating the error locator polynomial. In other words, it takes two clock cycles in carrying out each iteration.

The Berlekamp algorithm has been modified by Liu, wherein the number of multipliers is reduced to 4t+1, while the syndrome values are inputted every 3 symbol clock cycles e.g., K. Y. Liu, "Architecture for VLSI Design of Reed-Solomon Decoders", *IEEE Transactions on Computers*, vol. c-33, NO. 2, pp. 178–189, February, 1984). In the Liu algorithm, some of the variables are modified over those of the Berlekamp-Massey algorithm for a more efficient processing.

Numerous variables are involved in calculating the error locator polynomial in these algorithms, however. Further, in each iteration, certain of the variables are calculated prior to certain other variables because the former are used in calculating the latter. Consequently, all the multipliers are not used at the same time in each clock cycle.

SUMMARY OF THE INVENTION

It is, therefore, a primary object of the present invention to provide an improved method and apparatus capable of calculating an error locator polynomial by employing a reduced number of multipliers, thereby achieving a reduction in the processing time thereof as well as the manufacturing cost of the apparatus.

In accordance with the present invention, there is provided a method for providing an error locator polynomial of an nth iteration for use in a decoding system for decoding a transmitted signal encoded by using a Reed-Solomon code, based on a predetermined number of syndrome values, a group of variables of an (n-1)st iteration including a discrepancy and an error locator polynomial thereof, and an error locator polynomial of an (n-2)nd iteration, said method comprising the steps of:

(a) determining a temporal term based on the discrepancy of the (n-1)st iteration and the error locator polynomial of the (n-2)nd iteration;

(b) calculating a discrepancy of the nth iteration based on the syndrome values and the error locator polynomial of the (n-1)st iteration;

(c) deciding a correction term based on said temporal term and the discrepancy of the nth iteration; and (d) computing the error locator polynomial of the nth iteration based on the correction term and the error locator polynomial of the (n-1)st iteration.

BRIEF DESCRIPTION OF THE DRAWINGS

The above and other objects and features of the present invention will become apparent from the following description of preferred embodiments given in conjunction with the accompanying drawings, in which:

FIG. 1A shows a flow chart for calculating an error locator polynomial in the Berlekamp-Massey algorithm;

FIG. 1B represents a flow chart for calculating an error locator polynomial in the Liu algorithm;

DETAILED DESCRIPTION OF THE PREFERRED EMBODIMENTS

Figure 1C:
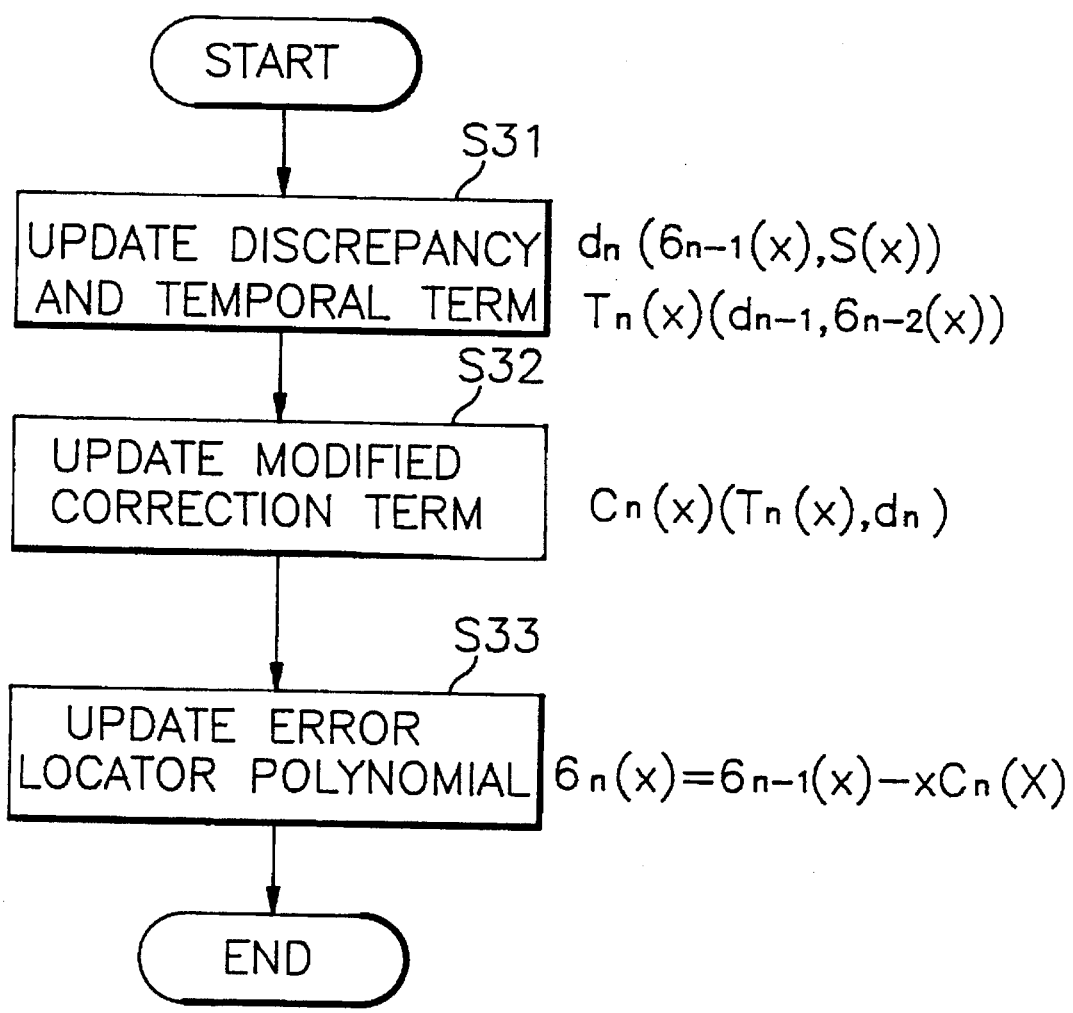
FIG. 1C offers a flow chart for calculating an error locator polynomial in accordance with the present invention.

Referring to FIGS. 1A to 1C, there are shown simplified flow charts for calculating an error locator polynomial in the Berlekamp-Massey algorithm, the Liu algorithm and the present invention, respectively.

The complete procedure to obtain an error locator polynomial includes a multiple number of, e.g., 2t, iterations, wherein t represents the error correcting capability of the code; and, on each iteration, the error locator polynomial is updated once(see Berlekamp, *Algebraic Coding Theory*, McGraw-Hill, 1968). The error locator polynomial is determined based on 2t syndrome values, wherein the syndrome values are obtained from received codewords encoded by using a Reed-Solomon code. The roots of the error locator polynomial indicate the error locations.

In the flow charts shown in FIGS. 1A to 1C, a part of the procedure performed on one, e.g, nth, iteration is exemplarily given, including such operation that imposes a large computational burden, e.g., a multiplication operation on a Galois Field. Specifically, in the procedure depicted in FIGS. 1A to 1C, the error locator polynomial is updated as follows:

$$\sigma_n(x) = \sigma_{n-1}(x) - d_n \times d_{n-1}^{-1} \cdot \sigma_{n-2}(x) \quad (2)$$

wherein n denotes the nth iteration; $d_n$ denotes a discrepancy which is calculated by using the syndrome values and the error locator polynomial of the previous iteration; and $\sigma_0(X)$ and $\sigma_1(X)$ are 1 and $1-d_1X$, respectively. As shown in FIG. 1A, the calculation of Eq. (2) is partitioned into 3 parts, in the Berlekamp-Massey algorithm. Specifically, in step S11, the discrepancy $d_n$ is calculated based on the syndrome values and the error locator polynomial of the previous iteration $\sigma_{n-1}(X)$. In step S12 the error locator polynomial is updated based on the discrepancy $d_n$ obtained in step S11 and a correction term. The correction term $b_n(X)$ is introduced to partition Eq. (2) and is defined as follows:

$$b_n(x) = d_n^{-1} \cdot \sigma_{n-1}(x) \quad (3)$$

The correction term from the previous iteration, i.e., $b_{n-1}(X)$, is used in obtaining the error locator polynomial $\sigma_n(X)$. The correction term is also updated in step S12 and used in updating the error locator polynomial on a next iteration.

In FIG. 1A, the values updated in each step are presented. The two values specified in corresponding parentheses are multiplied to update the discrepancy $d_n$, the correction term $b_n(X)$, and the error locator polynomial $\sigma_n(X)$. Each of the values represented in the form of a polynomial, e.g., $b_n(X)$, includes a set of values whose number is not greater than 2t. Therefore, calculation of each value includes a vector multiplication, wherein as many as 2t multipliers are needed to update each value, each multiplier performing a multiplication operation in the Galois Field. The procedural steps taken in the flow chart of FIG. 1A are summarized in Table 1:

TABLE 1

|  | 1st clock cycle | 2nd clock cycle |
| --- | --- | --- |
| M11 | $d_n$ |  |
| M12 |  | $\sigma_n(x) = \sigma_{n-1}(x) - d_n x \cdot b_{n-1}(x)$ |
| M13 |  | $b_n(x) = d_n^{-1} \cdot \sigma_{n-1}(x)$ | wherein M11, M12, and M13 denote a set of 2t multipliers in the Galois Field, respectively. Calculation of the error locator polynomial $\sigma_n(X)$ and the correction term $b_n(X)$ may be performed in a same clock cycle because one does not need the result from the other. It can be easily appreciated that 6t multipliers are needed altogether and each iteration is completed in 2 clock cycles in the Berlekamp-Massey algorithm.

In the Liu algorithm modifying the Berlekamp-Massey algorithm, calculation of Eq. (2) is also partitioned into 3 parts. However, instead of the correction term used in the Berlekamp-Massey algorithm, an intermediate term $d_n^*$ is used. The intermediate term is defined as:

$$d_n^* = d_n d_{n-1}^{-1} \quad (4)$$

wherein $d_n$ and $d_{n-1}$ represent the discrepancy of the current and that of the previous iteration, respectively.

FIG. 1B shows the procedure performed in the Liu algorithm in each iteration. Specifically, the operation performed in step S21 is the same as that of step S11 in FIG. 1A, Wherein the discrepancy $d_n$ is calculated. In step S22, the intermediate term $d_n^*$ is calculated based on the discrepancy $d_n$ of the current iteration and $d_{n-1}$ of the previous iteration. In step S23, the error locator polynomial is updated based on the intermediate term $d_n^*$ obtained in step S22 and the error locator polynomial of the (n-2)nd iteration $\sigma_{n-2}(X)$. The result of the operation depicted in FIG. 1B is the same as that of FIG. 1A.

In FIG. 1B, the values to be updated in each step are represented. Calculation of the discrepancy $d_n$ and the error locator polynomial $\sigma_n(X)$ includes a vector multiplication, while calculation of the intermediate term $d_n^*$ requires a scalar multiplication only. The operations performed in the flow chart of FIG. 1B are summarized in Table:

TABLE 2

| | 1st clock cycle | 2nd clock cycle | 3rd clock cycle |
| --- | --- | --- | --- |
| M21 | $d_n$ | | |
| m22 | | $d_n^* = d_n d_{n-1}^{-1}$ | |
| M23 | | | $\sigma_n(x) = \sigma_{n-1}(x) - d_n^* x \cdot \sigma_{n-2}(x)$ | wherein M21, M23 denote a set of 2t multipliers, respectively, and m22 denotes a scalar multiplier. The calculation of the three terms specified in Table 2 is performed in different clock cycles because $d_n^*$ and $\sigma_n(X)$ can be calculated after $d_n$ and $d_n^*$ have been obtained, respectively. It can be easily seen that (4t+1) multipliers are needed and each iteration is completed in 3 clock cycles in the Liu algorithm.

Referring to FIG. 1C, there is shown a procedure performed in each iteration in accordance with the present invention. In the present invention, a temporal term and a modified correction term are introduced; and, calculation of Eq. (2) is partitioned into 4 parts, wherein only three of them require a vector multiplication. The temporal term $T_n(x)$ is defined as:

$$T_n(x) = d_{n-1}^{-1} \cdot \sigma_{n-2}(x) \quad (5)$$

wherein $d_{n-1}$ is the discrepancy of the previous, i.e, (n-1)st, iteration and $\sigma_{n-2}(X)$ is the error locator polynomial of the (n-2)nd iteration. The modified correction term $c_n(X)$ is defined as:

$$c_n(X) = d_n \cdot T_n(X) \quad (6)$$

Specifically, in step S31, the discrepancy $d_n$ and the temporal term $T_n(x)$ are calculated. In step S32, the modified correction term $c_n(X)$ is determined based on the temporal term $T_n(x)$ and the discrepancy $d_n$ obtained in step S31. In step S33, the error locator polynomial $\sigma_n(X)$ is updated using the modified correction term $c_n(X)$. The result of the operation depicted in FIG. 1C is the same as that of FIGS. 1A and 1B.

In FIG. 1C, the values to be updated in each step are represented. Calculation of the discrepancy $d_n$, the temporal term $T_n(x)$ and the modified correction term $c_n(X)$ includes a vector multiplication, while updating of the error locator polynomial $\sigma_n(X)$ requires a vector addition only. It can be readily appreciated that the discrepancy $d_n$ and the temporal term $T_n(X)$ can be calculate in a same clock cycle using different sets of multipliers, because they do not require the result from each other. Furthermore, steps S32 and S33 can be performed in one clock cycle, because the latter does not require a multiplication operation. The operations performed in the flow chart of FIG. 1C are summarized in Table 3:

TABLE 3

|  | 1st clock cycle | 2nd clock cycle |
| --- | --- | --- |
| M31 | $d_n$ |  |
| M32 | $T_n(x) = d_{n-1}^{-1} \cdot \sigma_{n-2}(x)$ | $c_n(x) = d_n \cdot T_n(x)$ |
| A33 |  | $\sigma_n(x) = \sigma_{n-1}(x) - x \cdot c_n(x)$ | wherein M31, M32 denote a set of 2t multipliers and A33 denotes a set of adders. It can be easily seen that 4t multipliers in the Galois Field are needed and each iteration is completed in 2 clock cycles in case of the present algorithm.

Figures 2A, 2B, 2C:
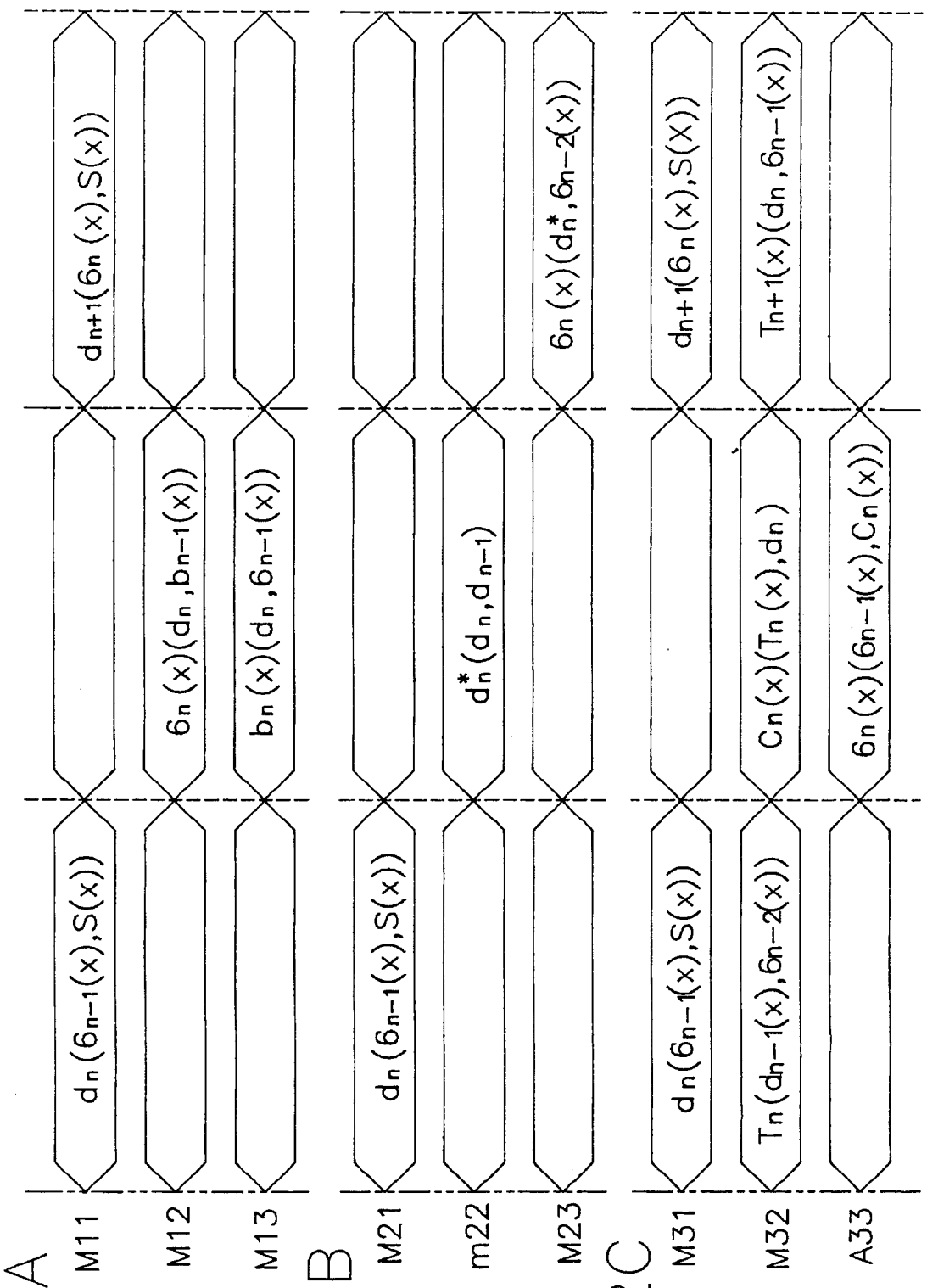
FIGS. 2A to 2C illustrate a timing diagram for calculating the inventive error locator polynomial.

The operations explained above are summarized and compared in FIGS. 2A to 2C. In the Berlekamp-Massey and Liu algorithms, different multipliers are used in calculating different values as shown in FIGS. 2A and 2B. However, in the present invention, a multiplier, i.e., M32, is employed to calculate two different variables alternately in each clock cycle as depicted in FIG. 2C, to thereby reducing the number of multipliers and the clock cycle for each iteration.

Figure 3:
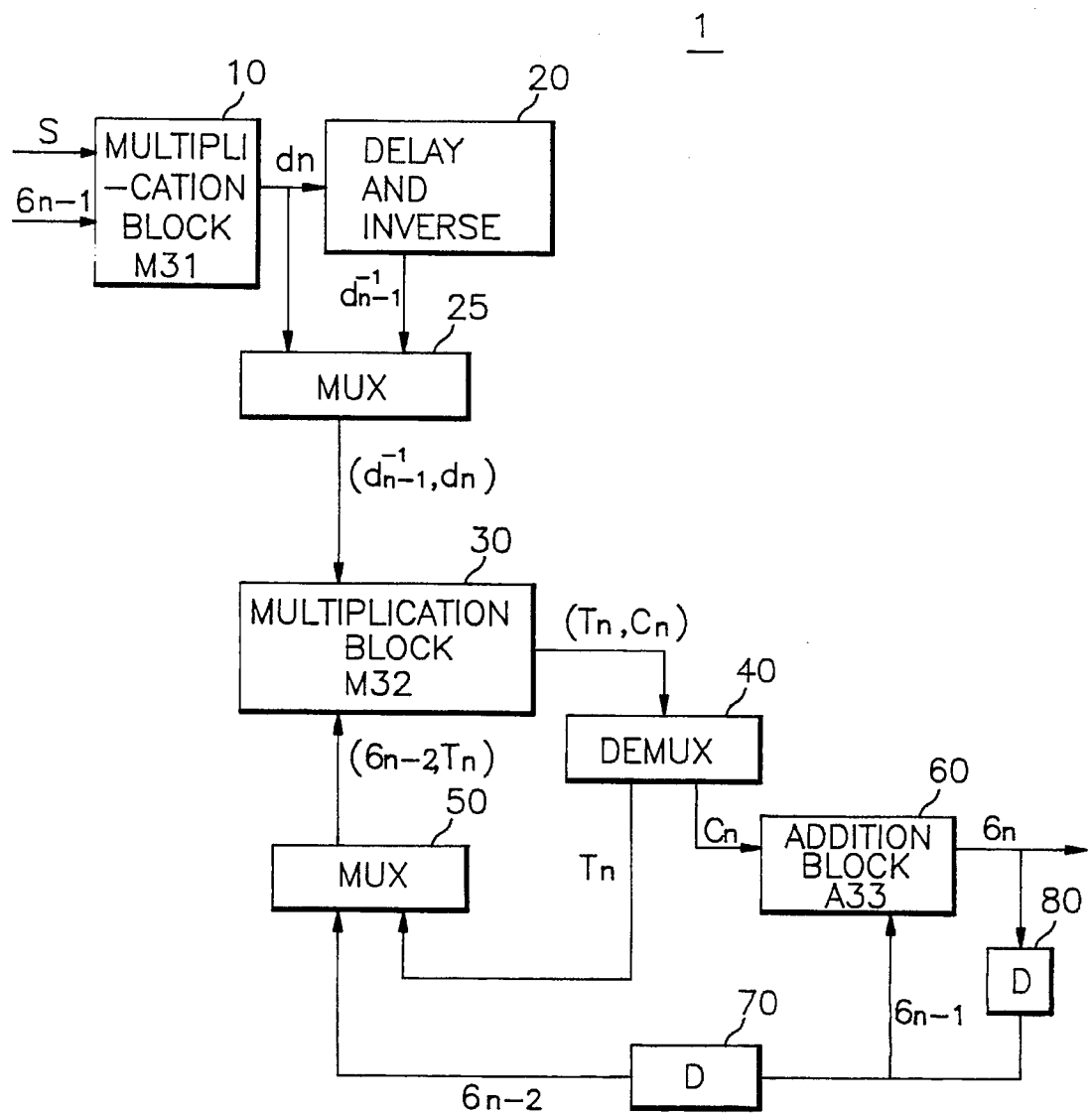
FIG. 3 depicts a block diagram of an apparatus for calculating the error locator polynomial in accordance with the present invention.

Referring to FIG. 3, there is shown a block diagram of an apparatus 1 for updating the error locator polynomial in accordance with the present invention. The apparatus 1 includes two multiplication blocks 10 and 30, and an addition block 60, which correspond to M31, M32 and A33 shown in Table 3.

The first multiplication block 10 calculates the discrepancy $d_n$, based on the syndrome values S and the error locator polynomial of the previous iteration $\sigma_{n-1}(X)$. The second multiplication block 30 calculates the temporal term $T_n(x)$ and the modified correction term $c_n(X)$ alternately, in response to a set of $d_{n-1}^{-1}$ and $\sigma_{n-2}(X)$, and a set of $T_n(x)$ and $d_n$, respectively. The addition block 60 updates the error locator polynomial $\sigma_n(X)$ in response to the modified correction term $c_n(X)$. Each of the multiplication blocks 10 and 30 may include 2t multipliers in the Galois Field for the vector multiplication. The addition block 60 may include 2t adders for the vector addition.

Specifically, the syndrome values S and the error locator polynomial of the previous iteration $\sigma_{n-1}(X)$ are coupled at the first multiplication block 10, thereby providing the discrepancy $d_n$. The discrepancy $d_n$ is coupled to a delay and inverse block 20, thereby providing $d_{n-1}^{-1}$, i.e., an inverse of the discrepancy of the previous iteration, to the second multiplication block 30 via a multiplexor 25. The discrepancy $d_n$ of the current iteration is also coupled to the multiplication block 30 via the multiplexor 25. At the multiplexor 25, one of the inputted values, i.e., $d_n$ or $d_{n-1}^{-1}$, is selected and provided to the second multiplication block 30. Specifically, at the first clock cycle of each iteration, $d_{n-1}^{-1}$ is selected, while $d_n$ is selected at the second clock cycle. $\sigma_{n-2}(X)$ and $T_n(X)$ are also inputted alternately to the second multiplication block 30, to thereby provide the temporal term $T_n(X)$ and the modified correction term $C_n(X)$ to a demultiplexor 40, alternately. The temporal term $T_n(X)$ is fed from the demultiplexor 40 to a multiplexor 50, to be provided to the second multiplication block 30 on the second clock cycle. The modified correction term $c_n(X)$ is fed from the demultiplexor 40 to the addition block 60. At the addition block 60, the error locator polynomial is updated based on the modified correction term $c_n(X)$ fed from the demultiplexor 40 and the error locator polynomial of the previous iteration $\sigma_{n-1}(X)$ which is provided from a delay block 80. The error locator polynomial of the previous iteration $\sigma_{n-1}(X)$ is also coupled to the multiplexor 50 via a delay block 70, to be provided to the second multiplication block 30 for the calculation of the temporal term on a next iteration.

By using the apparatus presented above, the error locator polynomial can be updated in two clock cycles.

While the present invention has been described with respect to the particular embodiments, it will be apparent to those skilled in the art that various changes and modifications may be made without departing from the spirit and scope of the invention as defined in the following claims.

What is claimed is:

1. A method for providing an error locator polynomial of an nth iteration for use in a decoding system for decoding a transmitted signal encoded by using a Reed-Solomon code, based on a predetermined number of syndrome values, a group of variables of an (n-1)st iteration including a discrepancy and an error locator polynomial thereof, and an error locator polynomial of an (n-2)nd iteration, said method comprising the steps of:

(a) determining a temporal term based on the discrepancy of the (n-1)st iteration and the error locator polynomial of the (n-2)nd iteration;

(b) calculating a discrepancy of the nth iteration based on the syndrome values and the error locator polynomial of the (n-1)st iteration;

(c) deciding a correction term based on said temporal term and the discrepancy of the nth iteration; and (d) computing the error locator polynomial of the nth iteration based on the correction term and the error locator polynomial of the (n-1)st iteration.

2. The method of claim 1, wherein said steps (a) and (b) as one unit of operation, and said steps (c) and (d) as another unit of operation are performed alternately, wherein each of said steps in each unit of operation is performed in a same clock cycle.

3. The method of claim 1, wherein the temporal term T(x) is represented as:

$$T(x) = d_{n-1}^{-1} \cdot \sigma_{n-2}(x),$$

$d_{n-1}$ and $\sigma_{n-2}(x)$ being the discrepancy of the (n-1)st iteration and the error locator polynomial of the (n-2)nd iteration;

the correction term c(x) is represented as:

$$c(x) = d_n \cdot T(x)$$

$d_n$ being the discrepancy of the nth iteration; and the error locator polynomial of the nth iteration $\sigma_n(x)$ is represented as:

$$\sigma_n(x) = \sigma_{n-1}(x) - x \cdot c(x),$$

$\sigma_{n-1}(x)$ being the error locator polynomial of the (n-1)st iteration.

4. An apparatus for providing an error locator polynomial of an nth iteration for use in a decoding system for decoding a transmitted signal encoded by using a Reed-Solomon code, based on a predetermined number of syndrome values, a group of variables of an (n-1)st iteration including a discrepancy and an error locator polynomial thereof, and an error locator polynomial of an (n-2)nd iteration, said apparatus comprising:

a first multiplication block for calculating a discrepancy of the nth iteration, based on the syndrome values and the error locator polynomial of the (n-1)st iteration;

a second multiplication block for alternately determining a temporal term based on the inverse of the discrepancy of the (n-1)st iteration and the error locator polynomial of the (n2)nd iteration; and a correction term based on said temporal term and said discrepancy of the nth iteration; and an addition block for computing the error locator polynomial of the nth iteration based on said correction term and said error locator polynomial of the (n-1)st iteration.

5. The apparatus of claim 4, wherein the error locator polynomial of the nth iteration is provided in a set of two clock cycles including a first and a second clock cycles; the discrepancy of the nth iteration and the temporal term are calculated at the first and the second multiplication blocks, respectively, during the first clock cycle; the correction term is calculated at the second multiplication block during the second clock cycle; and the error locator polynomial of nth iteration is calculated at the addition block during the second clock cycle.

6. The apparatus of claim 4, wherein the temporal term T(x) is represented as:

$$T(x) = d_{n-1}^{-1} \cdot \sigma_{n-2}(x),$$

$d_{n-1}$ and $\sigma_{n-2}(x)$ being the discrepancy of the (n-1)st iteration and the error locator polynomial of the (n-2)nd iteration;

the correction term c(x) is represented as:

$$c(x) = d_n \cdot T(x)$$

$d_n$ being the discrepancy of the nth iteration; and the error locator polynomial of the nth iteration $\sigma_n(x)$ is represented as:

$$\sigma_n(x) = \sigma_{n-1}(x) - x \cdot c(x),$$

$\sigma_{n-1}(x)$ being the error locator polynomial of the (n-1)st iteration.

* * * * *